United States Patent [19]

Ichimura et al.

[11] Patent Number: 4,880,399

[45] Date of Patent: Nov. 14, 1989

[54] SOCKET

[75] Inventors: Yoshiaki Ichimura, Tokyo; Shinichi Ishizuka, Tachikawa; Mitsuo Komoto; Shoji Umesato, both of Tokyo, all of Japan

[73] Assignees: Japan Aviation Electronics Industry, Limited; NEC Corporation, both of Tokyo, Japan

[21] Appl. No.: 301,098

[22] Filed: Jan. 25, 1989

[30] Foreign Application Priority Data

Feb. 3, 1988 [JP] Japan .................................. 63-13388

[51] Int. Cl.⁴ .......................................... H01R 13/352
[52] U.S. Cl. ................................................... 439/689
[58] Field of Search ................................ 439/686, 689

[56] References Cited

U.S. PATENT DOCUMENTS 2,445,604  7/1948  Clayton ................................ 439/689
3,148,927  9/1964  Winter .................................. 439/689
3,274,533  9/1966  Apted et al. ......................... 439/689

Primary Examiner—Joseph H. McGlynn
Attorney, Agent, or Firm—Pollock, Vande Sande and Priddy

[57] ABSTRACT

A socket for an IC, which is made up of a cover having an insulating protrusion and an insulating housing having a recess for receiving the protrusion. The cover includes a flat member which has made therethrough a plurality of arrays of pin insertion holes for insertion of pins of the IC or the like, and the insulating protrusion provided on the underside of the cover and extending along the arrays of pin insertion holes, guide grooves communicating with the pin insertion holes, respectively, being formed in side wall surfaces of the insulating protrusion. Contact pieces are held on side walls of the insulating housing.

7 Claims, 3 Drawing Sheets

FIG. 1 PRIOR ART
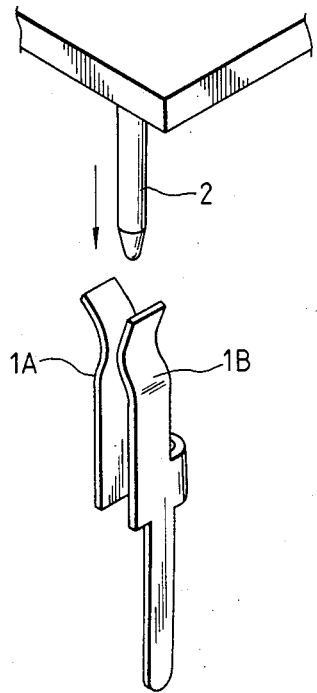
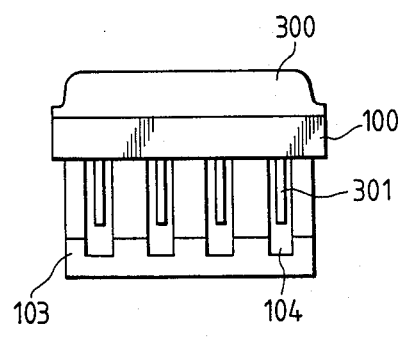
FIG. 3
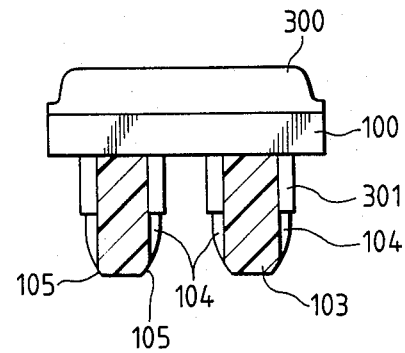
FIG. 4

SOCKET

BACKGROUND OF THE INVENTION

The present invention relates to a socket for connecting, for example, a PGA (Pin Grid Array) type IC to an electric circuit Contacts heretofore employed in sockets for IC's usually have such a structure as shown in FIG. 1, for instance, in which a pair of opposed contact pieces 1A and 1B are received in a contact receiving hole made in a housing (not shown) and a pin 2 of an IC is forced into the space defined by the contact pieces 1A and 1B to make electrical contact therewith.

With an increase in the integration density of IC's, the number of pins used also increases and some IC's have as many as hundreds of pins. Such IC's are commonly referred to as the PGA (Pin Grid Array) type, because the pins are protrusively provided in the form of a grid on an insulating package formed flat.

With an increase in the number of pins, their cross-sectional area decreases, inevitably leading to a decrease in their mechanical strength. Consequently, the conventional contact is not suitable for use in the socket for the PGA type IC in that when the IC is plugged into the socket, pins of the IC are readily deformed or broken, resulting in bad contact. Moreover, there is the possibility of the IC package being broken by large force which is needed for fitting hundreds of pins into contacts at one time.

Similar problems are encountered not only in IC's but also in other parts when the number of pins used is large.

SUMMARY OF THE INVENTION

It is therefore an object of the present invention to provide a socket into which a member to be connected can be plugged without applying excessive force to its pins and hence with no fear of deforming the pins and which does not need large force for plugging thereinto the member to be connected.

According to the present invention, the socket is made up of a cover which includes a flat insulating member having arrays of pin insertion holes made therethrough for insertion of pins of a member to be connected, an insulating protrusion protrusively provided on the underside of the flat insulating member, with its side wall surfaces lying along the arrays of pin insertion holes, and grooves cut in the side wall surfaces of the insulating protrusions for receiving the pins inserted through the pin insertion holes, and a socket body which includes an insulating housing having a recess made therein for receiving the insulating protrusion of the cover, contact pieces held on side walls of the recess for making contact with the pins received in the grooves of the insulating protrusion, and terminals electrically conducting to the contact pieces, respectively, and led out of the insulating housing on the side opposite from the cover.

With such an arrangement, the member to be connected and the cover are assembled into a unitary structure, with the pins of the former inserted into the pin insertion holes of the latter, and then the insulating protrusion of the cover is pressed into the recess of the socket body. In this case, the pins of the member to be connected are respectively received in the grooves of the insulating protrusion but slightly protrude out of the grooves, since the depth of each groove is selected a little smaller than the diameter of each pin. Consequently, when the insulating protrusion is pressed into the recess of the socket body, the contact pieces held on the side walls of the recess make contact with the pins, establishing the electrical connection between the terminals and the member to be connected.

Thus, according to the present invention, since the pins of the member to be connected are inserted into and pulled out of the socket body while being received in the grooves cut in the cover, no excessive force is applied to the pins, and consequently, the pins are not likely to be bent or broken when they are pressed into or pulled out of the socket body. Further, since the member to be connected is protected by the cover, the force for pressing the member into or pulling it out of the socket body is applied mainly to the cover, not directly to the package of the member to be connected. It is therefore possible to prevent that the member to be connected is broken when it is inserted into or pulled out of the socket body.

BRIEF DESCRIPTION OF THE DRAWINGS

FIG. 1 is a perspective view, for explaining the structure of a contact of a conventional socket;

FIG. 3 is a side view showing the state in which a member to be connected is mounted on a cover for use in the present invention;

FIG. 4 is a diagram, partly in section, for explaining the state in which the member to be connected is mounted on the cover;

DESCRIPTION OF THE PREFERRED EMBODIMENT

Figure 2:
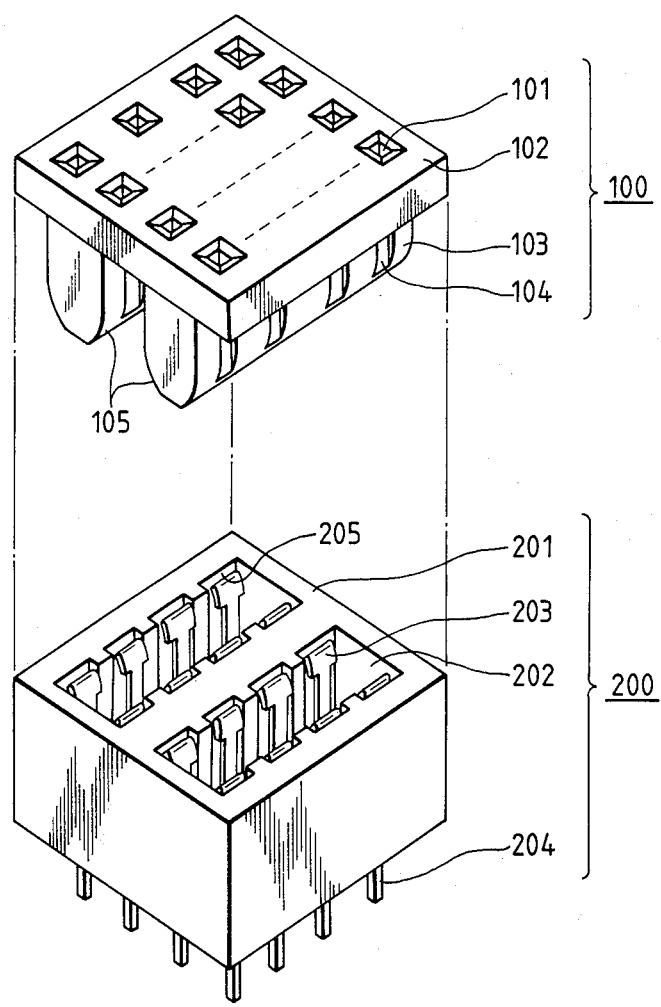
FIG. 2 is an exploded perspective view illustrating an embodiment of the present invention.

FIG. 2 illustrates an embodiment of the present invention. Reference numeral 100 indicates a cover and 200 a socket body. In this embodiment a member to be connected is an IC.

The cover 100 has a flat insulating member 102 which has pin insertion holes 101 arranged in the form of a grid, insulating protrusions 103 molded integrally with the flat insulating member 102 and projecting from its underside transversely thereof, and U-shaped grooves 104 cut in both sides of each insulating projection 103. The insulating projections 103 are each disposed with its side walls extending across the pin receiving holes 101 so that the grooves 104 communicate with the holes 101, respectively. The depth of each groove 104 is selected slightly smaller than the diameter (or thickness) of a pin 301 of an IC 300 (see FIGS. 3 to 5). When inserted into the groove 104 through the pin insertion hole 101, the pin 301 of the IC 300 is held a little protruding out of the groove 104.

The insulating protrusions 103 in this example are shown to be provided between arrays of the pin insertion holes 101. In this example, the pin insertion holes 101 are arrayed in four lines and the insulating protrusions 103 are provided in two lines accordingly. When the pin insertion holes 101 are arrayed in N lines, N/2 protrusions 103 are provided. The lower end portion of each insulating protrusion 103 is rounded at corners to form slopes 105 (see FIGS. 2 and 4).

The socket body 200 comprises an insulating housing 201, recesses 202 formed in the top of the insulating housing 201 for receiving the insulating protrusions 103, contact pieces 203 attached to side walls of the recesses 202, and terminals 204 each formed electrically as one body with the corresponding contact piece 203 and led out of the socket body 200 on the opposite side from the cover 100.

Figure 5:
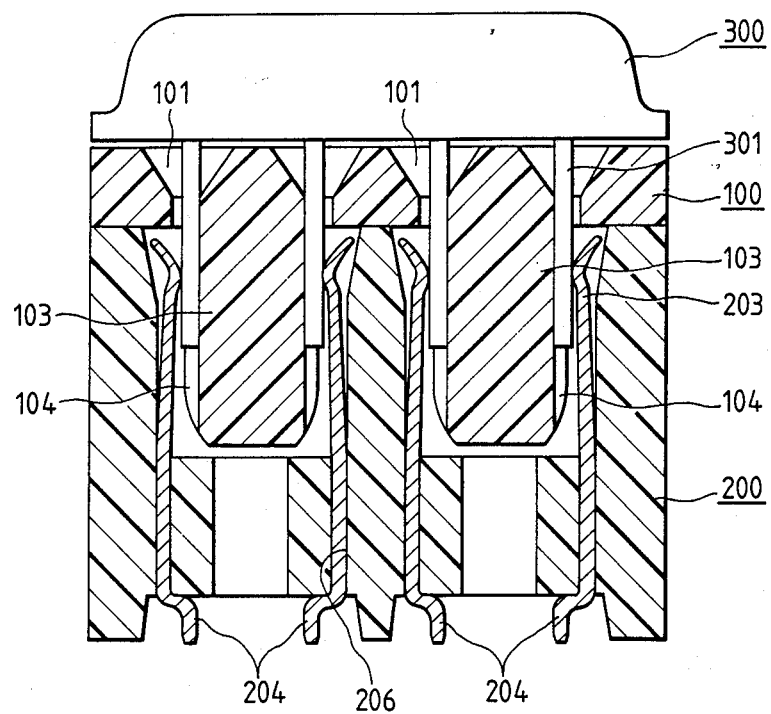
FIG. 5 is a sectional view, for explaining the state in which the member to be connected, mounted on the cover, is engaged with the socket body.

The recesses 202 in this example are each provided in the form of a narrow trough so as to receive the insulating protrusion 103 of the cover 100. The contact pieces 203 are held in grooves 205 cut in both side walls of the recesses 202 in opposing relation to the grooves 104 of the insulating protrusions 103. Each contact piece 203 is made of a conductive resilient material and supported by a cantilever structure in which its upper end portion is made free but its lower end portion is pressed into and secured to a slit 206 made in the bottom of the insulating housing 201 (FIG. 5). The upper free end portion of the contact piece 203 is prebiased toward the axis of the recess 202, and when the insulating protrusion 103 of the cover 100 is inserted into the recess 202, the contact piece 203 is resiliently biased toward the side wall of the recess 202 against the spring force of its own but, by virtue of its restoring force, the contact piece 203 makes contact with the pin 301 of the IC 300.

With such an arrangement as described above, the IC 300 is plugged into the socket by inserting all the pins 301 of the IC 300 into the grooves 104 of the insulating protrusions 103 through the pin insertion holes 101 of the cover 100 and then pressing the insulating protrusions 103 into the recesses 202 of the socket body 300 while urging the IC 300 against the cover 100. In this instance, each pair of opposed contact pieces 203 are spread out by the slopes 105 of the insulating protrusion 103 and, at the same time, guided to the position where the corresponding pins 301 are exposed out of the grooves 104, and as the insulating protrusion 103 is further pressed into the recess 202, the contact pieces 203 are further guided to override the pins 301 as shown in FIG. 5. In this state the contact pieces 203 contact, by the spring force of their own, the pins 301 and remain in good contact with them.

As described above, according to the present invention, the pins 301 of the IC 300 are received in the grooves 104 cut in the cover 100 and, in such a protected state, they are engaged with and disengaged from the socket body 200. This eliminates the possibility of the pins 301 being bent or broken when they are pressed into contact with the contact pieces 203.

Furthermore, since the contact pieces 203 are gradually pressed outward by the slopes 105 of the insulating protrusions 103 when they come into contact with the pins 301, the force for pressing the insulating protrusions 103 into the recesses 202 can be reduced.

Figure 6:
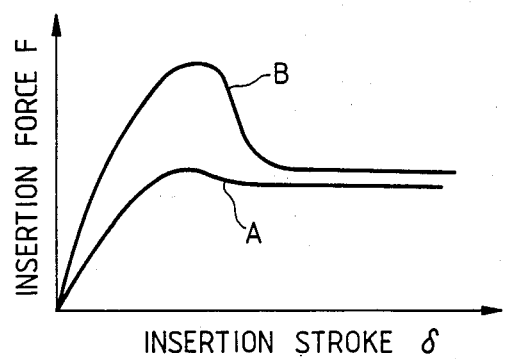
FIG. 6 is a graph showing force for insertion into the socket of the present invention and the conventional one.

FIG. 6 shows the force for insertion into the socket of the present invention, in comparison with the force for insertion into the conventional socket, the curve A being an insertion stroke vs. insertion force characteristic of the socket according to the present invention and the curve B the insertion stroke vs. insertion force of the conventional socket.

As will be seen from FIG. 6, according to the conventional socket, when pins of a member to be connected thereto begin to contact the contact pieces, the insertion force abruptly increases because the pins directly thrust the contact pieces aside. (At this time, excessive force is applied to the pins, often bending or breaking them.)

In contrast thereto, since the socket of the present invention has a structure in which the contact pieces 203 are gradually pushed aside by the insulating protrusions 103 of the socket cover 100 and then guided to override the pins 301 received in the grooves 104 of the insulating protrusions 103 but slightly sticking out therefrom, the insertion force only gently changes throughout the entire inserting operation and no large insertion force is needed.

As will be appreciated from the above, the present invention offers a highly reliable socket which is free from the possibility of breaking or bending the pins even if a member to be connected is frequently engaged with and disengaged from the socket. Moreover, even if the member to be connected has a large number of pins, there is no fear of breaking its package, because the insertion force needed is small.

The present invention offers another advantage that the pins of the member to be connected can be protected during its transportation if the cover 100 is held attached to the member to be connected.

It will be apparent that many modifications and variations may be effected without departing from the scope of the novel concepts of the present invention.

What is claimed is:

1. A socket comprising:
   (A) a cover including a flat insulating member having a plurality of arrays of holes made therethrough for insertion of pins of a member to be connected to the socket, at least one insulating protrusion protrusively provided on the underside of the flat insulating member, with its side wall surfaces lying along the arrays of pin insertion holes, and guide grooves cut in the side wall surfaces of the insulating protrusion for guiding the pins inserted through the pin insertion holes; and
   (B) a socket body including an insulating housing having at least one recess made therein for receiving the insulating protrusion of the cover, a plurality of contact pieces held on side walls of the recess for making contact with the pins guided by the guide grooves, and terminals electrically conducting to the contact pieces and led out of the insulating housing on the side opposite from the cover.

2. The socket of claim 1, wherein the side walls of the recess formed in the insulating housing have contact piece positioning grooves opposite the guide grooves, respectively.

3. The socket of claim 1, wherein the insulating protrusion is provided every two arrays of pin insertion holes between them and extends in the direction of the arrays of pin insertion holes and the guide grooves are formed in both side wall surfaces of each of such insulating protrusions.

4. The socket of claim 3, wherein the contact pieces are held along the opposed side walls of the recess.

5. The socket of claim 1, 2, 3 or 4, wherein the lower end portion of the insulating protrusion has slopes at both sides.

6. The socket of claim 1, 2, 3 or 4, wherein each of the contact pieces is a long, narrow plate-like member, its front end being free and bent toward the side wall of the recess and its rear end being fixed to the insulating housing.

7. The socket of claim 1, 2, 3 or 4, wherein at least two insulating protrusions are provided in parallel.

* * * * *